United States Patent [19]

Temple

[11] 4,079,403
[45] Mar. 14, 1978

[54] THYRISTOR DEVICE WITH SELF-PROTECTION AGAINST BREAKOVER TURN-ON FAILURE

[75] Inventor: Victor A. K. Temple, Clifton Park, N.Y.

[73] Assignee: Electric Power Research Institute, Inc., Palo Alto, Calif.

[21] Appl. No.: 737,492

[22] Filed: Nov. 1, 1976

[51] Int. Cl.² .................................... H01L 29/90
[52] U.S. Cl. .................................. 357/13; 357/20; 357/38; 357/52; 357/55
[58] Field of Search ............... 357/38, 55, 52, 13, 357/20

[56] References Cited

U.S. PATENT DOCUMENTS

| | | | |
|---|---|---|---|
| 3,408,545 | 10/1968 | De Cecco et al. | 357/38 |
| 3,562,610 | 2/1971 | Stehney | 357/55 |
| 3,566,212 | 2/1971 | Svedberg | 357/38 |
| 3,771,029 | 11/1973 | Burtscher et al. | 357/38 |
| 3,774,085 | 11/1973 | Platzoeder et al. | 357/38 |

OTHER PUBLICATIONS

Y. Kao et al., "High Voltage Planar P-N JCNS," Proc. IEEE, vol. 55, #8, Aug. 1967, pp. 1409-1414.
S. Sze, "Physics of Semiconductor Devices," Wiley--Interscience, © 1969, pp. 85, 119-126.

Primary Examiner—Stanley D. Miller, Jr.
Assistant Examiner—Joseph E. Clawson, Jr.
Attorney, Agent, or Firm—Flehr, Hohbach, Test, Albritton & Herbert

[57] ABSTRACT

Self-protection against breakover turn-on failure is achieved for a thyristor by providing for adjustment of the curvature of the planar junction termination in the gate region. In addition, breakdown of the outer edge of the device at the junctions is maintained at a relatively higher breakdown voltage by the techniques of beveling, floating field rings or by etching around the cathode emitter region.

7 Claims, 8 Drawing Figures

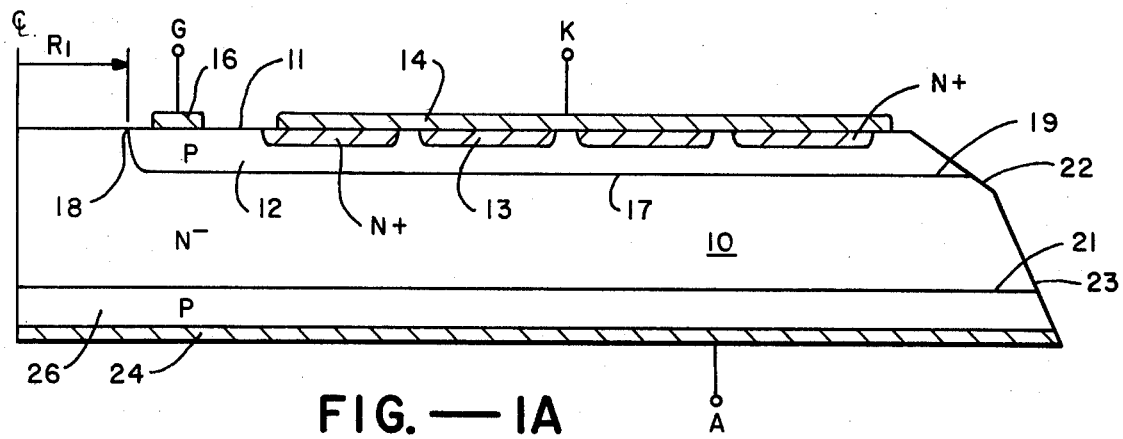
FIG.—1A
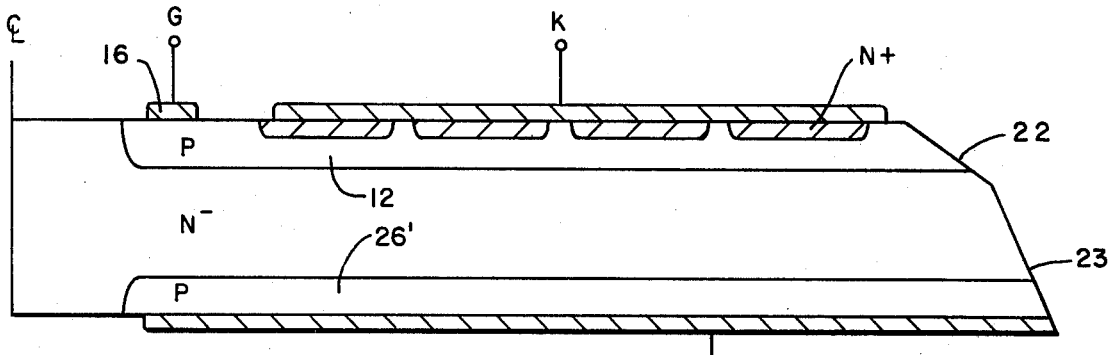
FIG.—1B
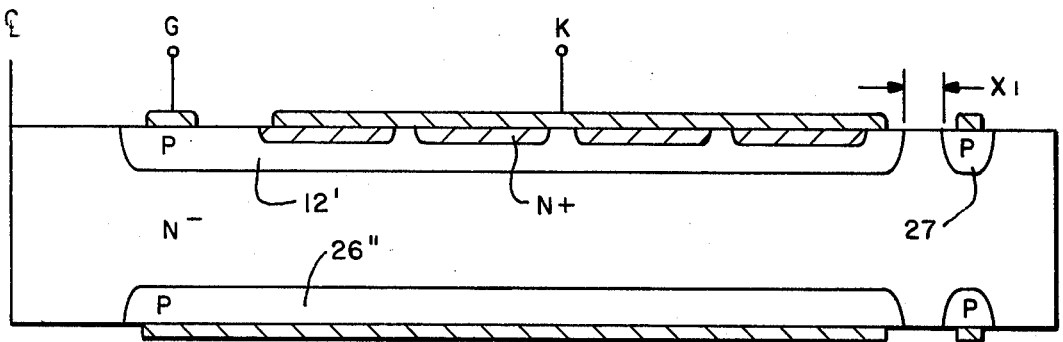
FIG.—1C
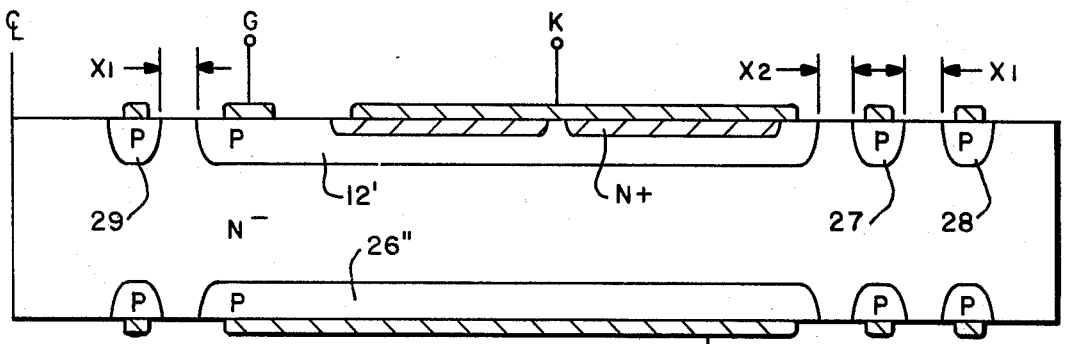
FIG.—1D

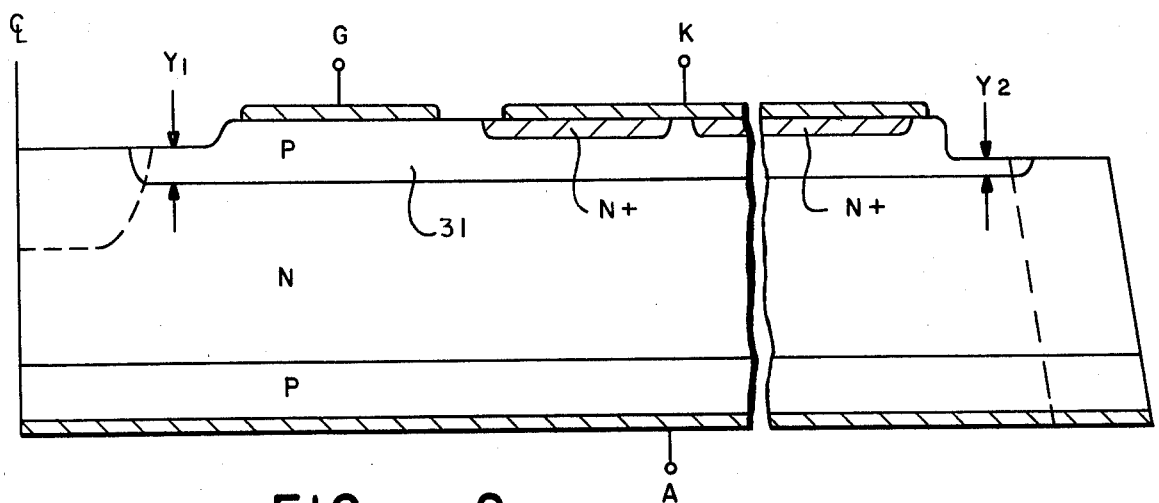
FIG.—2
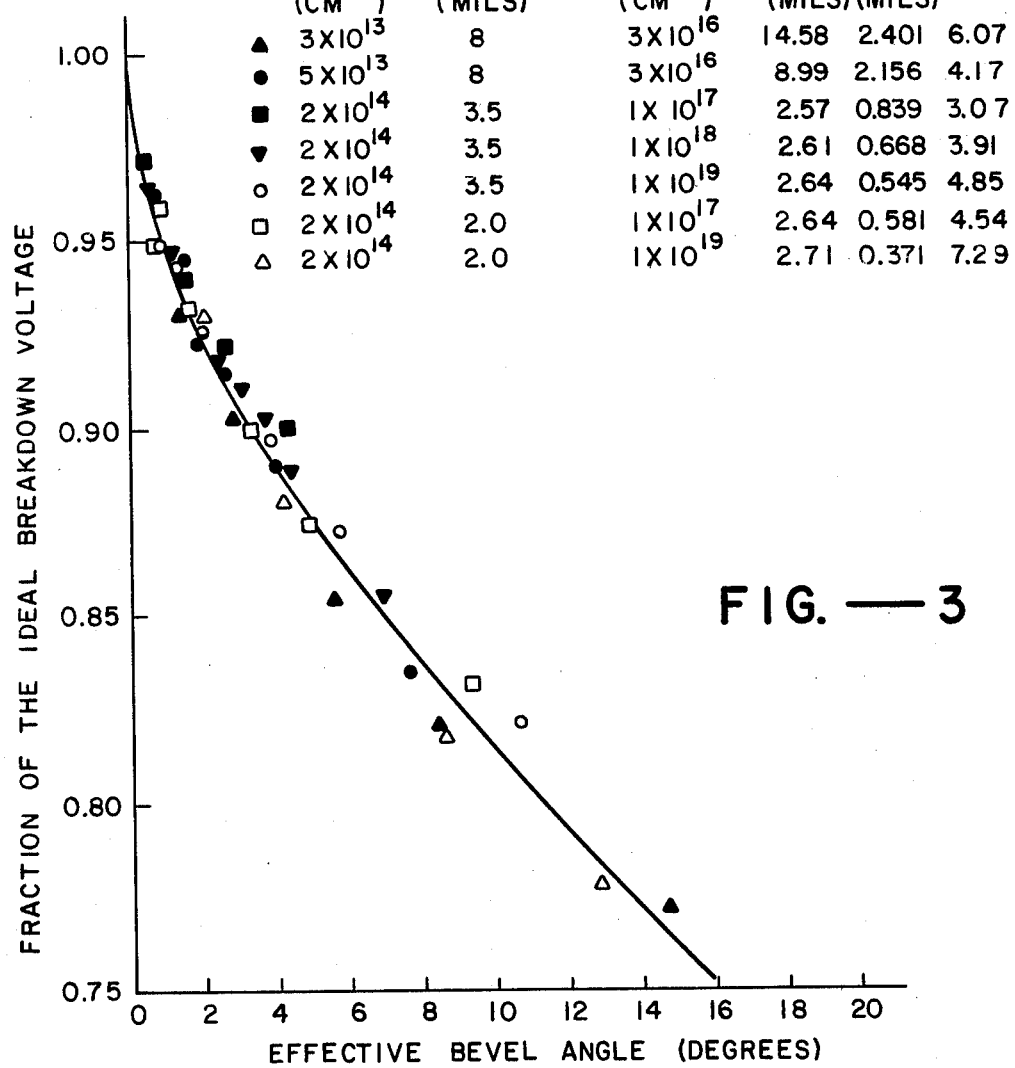
FIG.—3

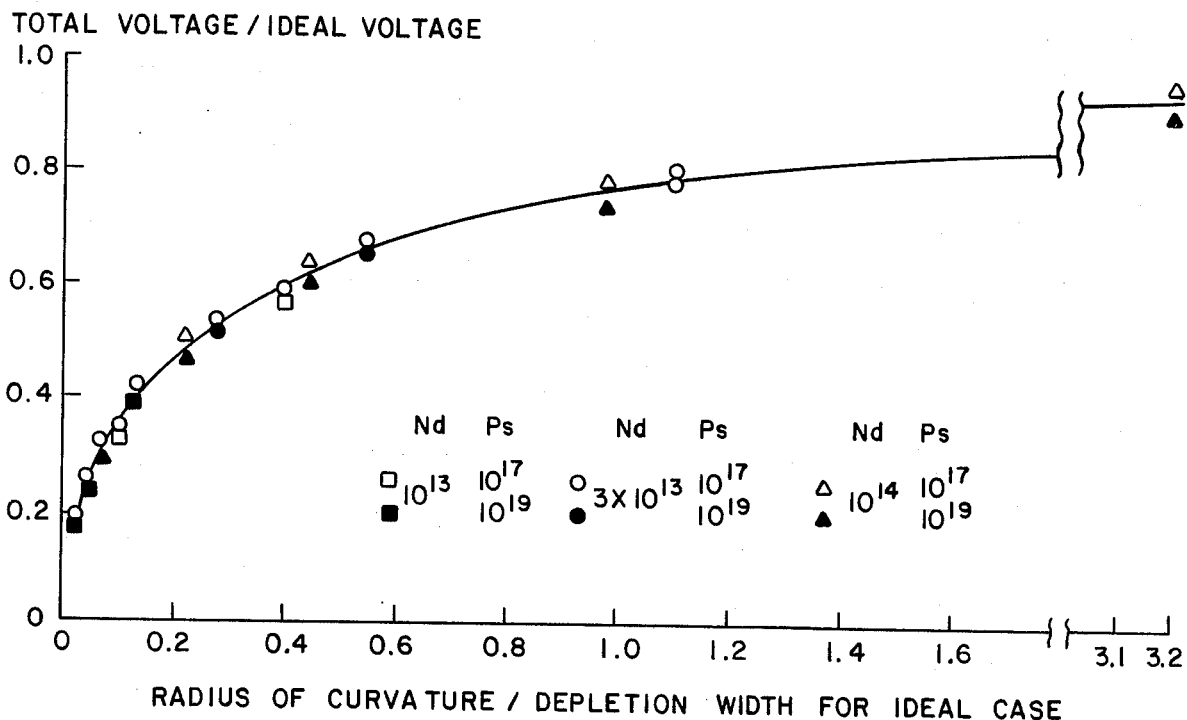
FIG. — 4
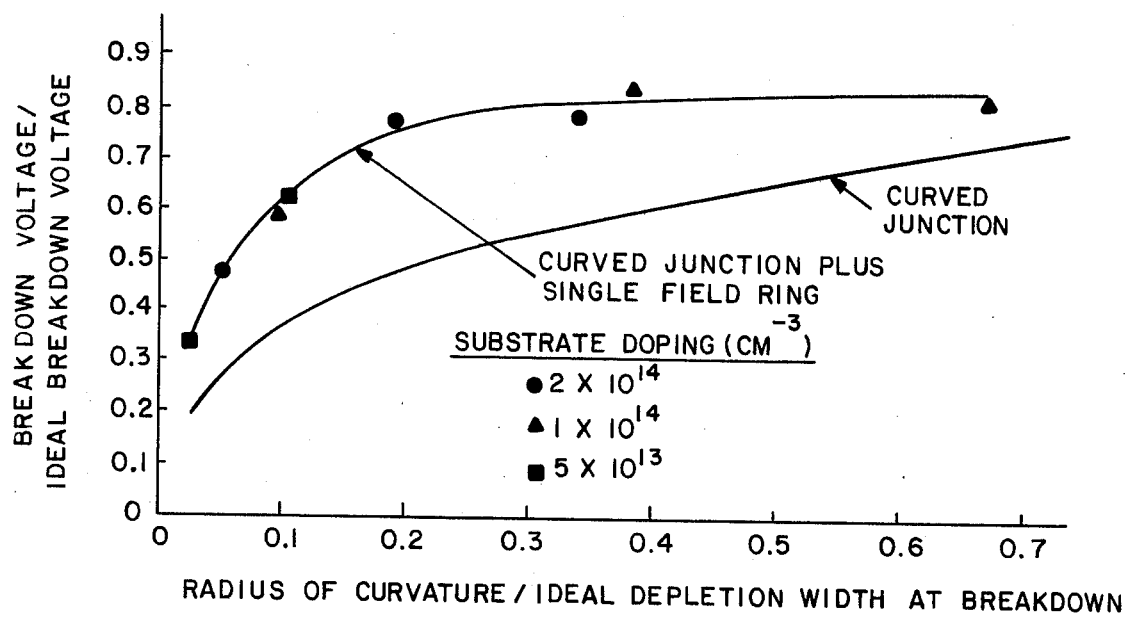
FIG. — 5

THYRISTOR DEVICE WITH SELF-PROTECTION AGAINST BREAKOVER TURN-ON FAILURE

BACKGROUND OF THE INVENTION

The present invention is directed to a thyristor device with self-protection against breakover turn-on failure and more specifically to a device which achieves its self-protection through planar junction curvature effects.

The main emitter area of a thyristor is very prone to failure during breakover turn-on initiated by excessive device voltage. The location of the turn-on point (usually the location of the maximum avalanche current) is not subject to control and will usually be situated somewhere under the cathode emitter rather than in some more desired location such as under the gate area of the device.

One prior technique which sought to achieve initial breakdown under the gate area is described in an article in *Solid State Electronics*, Volume 27, page 655, 1974, by Peter Voss. That article discloses a base region which has been carefully prepared so that its highest donor concentration is located precisely under the gate contact. The dependence of avalanche breakdown on such concentration assures that this area will breakdown first and thus protect the device. Naturally such adjustment of donor concentration is difficult.

Another method involves external circuitry which is connected between the anode and the gate of the thyristor. The breakover voltage of this external circuit is adjusted so that the circuit itself breaksover before the main emitter of the thyristor which is to be protected. Thus the gate of the device is fired in the normal manner. This method is, however, costly and requires extra components.

Two copending applications disclose and claim other possibilities for the local lowering of breakdown voltage in transistor and thyristor structures. These make use of the fact that alpha times M being equal to one is a turn-on criteria where alpha is the current gain or the base transport factor of the structure and M is the avalanche multiplication factor. In one copending application in the names of Temple and Baliga the selected base life time control is used to increase alpha and lower the breakover voltage. In the other copending application, also in the names of Temple and Baliga, Ser. No. 737,385, filed Nov. 1, 1976, pre-etch techniques are used to provide a locally thinner base. Both the above possibilities suffer from the fact that the device will be more sensitive to $dV/dt$ and to thermal leakage current turn-on than if M alone is made a larger valued function of voltage. This makes them somewhat more complicated to apply without loosing some $dV/dt$ capability.

OBJECTS AND SUMMARY OF THE INVENTION

It is, therefore, an object of the present invention to provide an improved technique of insuring a desirable mode of turn-on at breakover to self-protect a thyristor from breakover turn-on failures.

In accordance with the above object there is provided a thyristor device with self-protection against breakover turn-on failure which comprises a semiconductive substrate of one conductivity type with a planar surface. A region of opposite conductivity type is inset through the surface into the region of one conductivity type which forms a PN junction and has a gate area and a cathode emitter area. The region of opposite conductivity has at least a portion of the PN junction extending to the surface near the gate area and has a radius of curvature which provides a lower breakdown voltage in the region near the gate area relative to the remainder of the device.

BRIEF DESCRIPTION OF THE DRAWINGS

FIGS. 1A through 1D are partial cross-sectional views of alternative embodiments of the invention;

FIG. 2 is a cross-sectional view of another embodiment of the invention;

FIG. 3 is a graph useful in understanding one embodiment of the invention;

FIGS. 4 and 5 are additional graphs useful in understanding the concepts of the present invention.

BRIEF DESCRIPTION OF THE PREFERRED EMBODIMENT

FIGS. 1A through 1D show various embodiments of four layer thyristor devices. The devices include an anode, cathode and gate labeled A, K and G respectively. The configuration of FIGS. 1A through 1D and FIG. 2 are all circular with the center line being the center of the circle.

Referring to FIG. 1A there is provided an N type substrate region 10 which has inset into its surface 11 a P type region 12. An oppositely doped structure, i.e. P-type substrate etc., may, of course, also be used. N+ regions 13 are inset into P region 12 on which is placed the metallization 14 for the cathode. On the left edge of the P region 12 is the metallization 16 for the associated gate region. Region 12 forms the PN junction 17 with substrate 10 which has an upturned end 18 extending to surface 11 in the gate region or that is, near the gate area 16. The radius of curvature of this junction portion 18 is adjusted to provide lower breakdown voltage in this region relative to the remainder of the device.

More specifically FIG. 4 shows the ratio of planar junction breakdown voltage to an ideal one dimensional junction breakdown voltage as a function of normalized radius of curvature. Details of the derivation of this curve and the technique for producing a suitable lower breakdown voltage is described in an article by M. S. Adler and V. A. K. Temple, "Calculation of the Curvature Related Avalanche Breakdown in High Voltage Planar P-N Junctions," IEEE Trans. Electron Devices, 1975.

However, in FIG. 1A the outer edge or periphery of the disc-like device (the right side looking at the drawing) is merely a plane junction as illustrated at 19 and 21. As high as possible a breakdown voltage should be obtained at these outer edges which constitute the main forward and reverse blocking junctions of the thyristor. This is achieved by the use of the different angles of beveling shown at 22 and 23. The effect of beveling is illustrated in FIG. 3 and is described in an article by M. S. Adler and V. A. K. Temple "A General Method for Predicting the Avalanche Breakdown Voltage in Negative Bevelled Devices," IEEE Trans. Electron Devices 1976.

The remainder of the thyristor of FIG. 1A includes the anode metallization layer 24 along with the P type region 26.

The only significant processing required to produce the device of FIG. 1A is a masked P diffusion.

Finally, the device of FIG. 1A also allows for an additional important breakdown voltage control parameter. This is the distance or diameter $2R_1$ between the PN junction terminations 18 on the surface. The smaller the $2R_1$ distance compared to the N minus base depletion width at the breakdown voltage, the less pronounced are the effects of the curvature.

FIG. 1B differs from FIG. 1A in that both the upper and lower P diffusions 12 an 26' are planar. Thus, this device will first avalanche in the desired location near the gate area. The right edge of FIG. 1B still utilizes the beveling 22 and 23 to maintain a higher breakdown voltage than that under the gate area 16.

Where it is desired to have all of the junctions planar as shown in FIGS. 1C and 1D with the P regions 12' and 26", a floating field limiting ring technique would be utilized with either the single ring 27 as shown in FIG. 1C or the double rings 28 and 29 as shown in FIG. 1B. Viewed from above rings 27, 28, and 29 would be concentric. Such ring technique is described in an article by M. S. Adler, V. A. K. Temple, and A. P. Ferro "Breakdown Voltage for Planar Devices with a Single Field Limiting Ring," Proceedings of the IEEE PESC, 1975. FIG. 5 illustrates the effect of the field ring. In the case of FIG. 1D, Table I indicates that the interior ring 29 adjusts the breakdown voltage upward to 2700 volts which is still below the edge voltage of 2850 volts.

FIG. 2 illustrates yet another embodiment where some of the adverse effects of curvature in the inner gate region need to be alleviated. This would be the case, for example, in high voltage structures in which other considerations such as P diffusion masking problems or forward drop would prevent one from making as deep a junction and as small a curvature as might be desired. More specifically the structure of FIG. 2 utilizes a depletion etch technique where the periphery around the P region 31 is etched as shown by the dimensions $Y_1$ and $Y_2$. Such etching technique is described in an article by V. A. K. Temple and M. S. Adler "A Simple Etch Contour for Near Ideal Breakdown Voltage in Plane and Planar P-N Junctions," Proc. IEDM, 1975.

The actual design parameters are shown in Table I which apply to a high voltage thyristor utilizing this design configuration of the present invention the appropriate figures being referred to. It should be noted that in all of the cases, the design has been optimized so that the center region breakdown voltage is several hundred volts lower than the edge breakdown voltage.

Furthermore, whereas the diagrams and discussions have dealt with a particular structure with circular symmetry the invention applies equally well to structures with complimentary doping profiles and properly designed non-circular geometries.

Table I

Design of a $5 \times 10^{13}$/cc N-type Substrate for Some of the Geometrics of FIGS. 1 and 2

| Geometry | $P_{base}$ Junction Depth, Surface Concentration | Distance Parameters (in mils) | Gate Region Avalanche Breakdown Voltage | Main Thyristor Region Aval. Breakdown Voltage |
|---|---|---|---|---|
| 1. FIG. 1A or 1B | 7 mils, $3 \times 10^{16}$/cc | $R_1 = 20$ | 2420 | 2800 (6° negative bevel) |
| 2. FIG. 1A or 1B | 7 mils, $3 \times 10^{16}$/cc | $R_1 = 7.5$ | 2450 | 2800 (6° negative bevel) |
| 3. FIG. 1A or 1B | 7 mils, $3 \times 10^{16}$/cc | $R_1 = 5$ | 2600 | 2800 (6° negative bevel) |
| 4. FIG. 1A or 1B | 7 mils, $3 \times 10^{16}$/cc. | $R_1 = 2.5$ | 2900 | 3250 (positive bevel) |
| 5. FIG. 1C | 7 mils $3 \times 10^{16}$/cc | $R_1 = 20$, $X_1 = 2.5$ | 2450 | 2700 (single field ring) |
| 6. FIG. 1D | 7 mils $3 \times 10^{16}$/cc | $R_1=20, X_1=2.5$, $X_2 = 1.25$ | 2700 (single field ring) | 2850 (double field ring) |
| 7. FIG. 2 | 7 mils $3 \times 10^{16}$/cc | $R_1 = 20$, $Y_1 2.5$, $Y_2 = 1.8$ | 2450 | 3000 (depletion etch method) |

What is claimed is:

1. A thyristor device having a cathode anode, a first base with a gate and a second base and with self-protection against breakover turn-on failure comprising: a semiconductive substrate of one conductivity type with a planar surface and forming said second base; a region of opposite conductivity type, forming said first base, and inset through said surface into said region of said one conductivity type forming a PN junction said region of opposite conductivity type having a gate area and a cathode emitter area, at least a portion of said PN junction extending to said surface near said gate area with a radius of curvature to provide a lower breakdown voltage in the region near said gate area relative to the remainder of said device.

2. A device as in claim 1 where said PN junction extends to the edge of said substrate and including means for maximizing the breakdown voltage of said PN junction at said edge.

3. A device as in claim 2 where said means include a bevelled substrate.

4. A device as in claim 2 where said means include a floating field ring junction around said cathode emitter area.

5. A device as in claim 2 where said means include an etched periphery around said cathode emitter area.

6. A device as in claim 1 in which the breakdown voltage of said gate area is adjusted upward by the use of a floating limiting ring located in said substrate adjacent said PN junction at said surface.

7. A device as in claim 1 in which the breakdown voltage of said gate area is adjusted upward by an etch of controlled depth in said gate area.

* * * * *